(12) United States Patent  
Branson et al.

(10) Patent No.: US 11,946,980 B2
(45) Date of Patent: Apr. 2, 2024

(54) IDENTIFICATION AND SELECTION OF THE SOURCE OF ELECTRIC POWER

(71) Applicant: International Business Machines Corporation, Armonk, NY (US)

(72) Inventors: Michael J. Branson, Rochester, MN (US); Ryan K. Cradick, Oronoco, MN (US)

(73) Assignee: International Business Machines Corporation, Armonk, NY (US)

( * ) Notice: Subject to any disclaimer, the term of this patent is extended or adjusted under 35 U.S.C. 154(b) by 150 days.

(21) Appl. No.: 16/997,205

(22) Filed: Aug. 19, 2020

(65) Prior Publication Data

US 2022/0057457 A1   Feb. 24, 2022

(51) Int. Cl.
*H02J 3/38* (2006.01)
*G01R 31/58* (2020.01)

(52) U.S. Cl.
CPC ............. *G01R 31/58* (2020.01); *H02J 3/381* (2013.01); *H02J 2300/24* (2020.01); *H02J 2300/28* (2020.01); *H02J 2310/58* (2020.01); *H02J 2310/70* (2020.01)

(58) Field of Classification Search
CPC ...... G01R 31/58; H02J 3/381; H02J 2300/24; H02J 2300/28; H02J 2310/58; H02J 2310/70; H02J 13/00002; H02J 2300/20; G06Q 50/06
See application file for complete search history.

(56) References Cited

U.S. PATENT DOCUMENTS

| | | | |
|---|---|---|---|
| 8,581,550 B2 | 11/2013 | Lin et al. | |
| 9,878,626 B2 | 1/2018 | Sako | |
| 2009/0304101 A1* | 12/2009 | LoPorto | B60L 53/305 |
| | | | 455/70 |
| 2011/0084644 A1* | 4/2011 | Rauner | G06Q 10/06 |
| | | | 320/109 |
| 2013/0082529 A1 | 4/2013 | Wolter | |
| 2013/0138542 A1 | 5/2013 | Sirton | |
| 2013/0226484 A1* | 8/2013 | Rouvala | H02J 3/24 |
| | | | 702/61 |
| 2015/0309549 A1 | 10/2015 | Okabe | |
| 2016/0129798 A9 | 5/2016 | Sirton | |
| 2018/0131221 A1 | 5/2018 | Ambroziak et al. | |
| 2018/0139069 A1 | 5/2018 | Rawlins et al. | |
| 2020/0091855 A1 | 3/2020 | Pevear et al. | |
| 2020/0142373 A1 | 5/2020 | Stoner | |
| 2020/0180465 A1* | 6/2020 | Watson | B60L 53/68 |
| 2021/0011086 A1 | 1/2021 | Meadows | |
| 2021/0151988 A1* | 5/2021 | Milivojevic | H02J 7/35 |

OTHER PUBLICATIONS

Branson et al., "Identification and Selection of the Source of Electric Power," U.S. Appl. No. 16/997,169, filed Aug. 19, 2020.
List of IBM Patents or Patent Applications Treated as Related, dated Aug. 12, 2020, 2 pages.

\* cited by examiner

*Primary Examiner* — Charles Cai (74) *Attorney, Agent, or Firm* — Peter J. Edwards (57) ABSTRACT

Information indicating a source of electric current can be transmitted alongside or within the electric current itself, enabling downstream recipients to identify a source of their electricity. The information may be embedded directly into the electric current, such as by adding a modulated carrier signal to an alternating current before transmitting the current to a downstream recipient.

20 Claims, 5 Drawing Sheets

IDENTIFICATION AND SELECTION OF THE SOURCE OF ELECTRIC POWER

BACKGROUND

The present disclosure relates to electric power, and more specifically, to enabling identification of a source of electricity.

Electric power, electric cars, etc. may often be considered "green" or environmentally friendly, particularly when compared to fossil fuels. However, electric power can come from many different types of sources. For example, a significant amount of the electricity generated today comes from burning coal. Other sources also exist, such as waste-to-energy facilities, etc.

The flow of electricity may include several entities. Typically, electricity is generated at a source, such as a power plant or station. The electricity is then transmitted (using the electric grid) to an end user (such as a home, business, etc.), possibly via one or more intermediaries such as a substation.

SUMMARY

Some embodiments of the present disclosure can be illustrated as a method. The method comprises identifying a source of an electric current. The method further comprises generating a downstream source identifier based on the source. The method further comprises generating a downstream electric current based on the electric current. The method further comprises embedding the downstream source identifier into the downstream electric current. The method further comprises transmitting the downstream electric current including the downstream source identifier.

Some embodiments of the present disclosure can also be illustrated as a computer program product comprising a computer readable storage medium having program instructions embodied therewith, the program instructions executable by a computer to cause the computer to perform the method discussed above.

Some embodiments of the present disclosure can be illustrated as a system. The system may comprise memory and a central processing unit (sometimes referred to herein as a "CPU"). The CPU may be configured to perform the method discussed above.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure. Features and advantages of various embodiments of the claimed subject matter will become apparent as the following Detailed Description proceeds, and upon reference to the drawings, in which like numerals indicate like parts, and in which:

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to systems and methods to track sources of electric power. More particular aspects relate to a method to generate, distribute, and receive electric power and a source identifier describing a type of the electric power.

Some energy consumers may care about the source of their electricity; for example, users may wish to avoid electricity originating from sources they may not consider environmentally friendly such as coal or natural gas, instead preferring electricity from traditionally "green" sources such as solar, wind, hydroelectric, geothermal, etc.

An example electric power grid may be divided into two levels of supply—a transmission level and a distribution level. The transmission level generally refers to transmission of electric power in the form of electric current (typically at a relatively high voltage) from power plants to substations. A power plant may generate and supply power (energy over time) and allow a substation to draw from the plant's power supply. The distribution level refers to distribution of electric power in the form of electric current (typically at a relatively lower voltage) from substations to end users.

Throughout this disclosure, reference is made to "electric power," one or more "electric power streams," and "electric signals." As used herein, "electric power" is essentially synonymous with "electricity," referring to the manipulation of electric potential for the purpose of transferring energy over time (power). As an example, a coal power plant may burn coal in order to generate electric power (also referred to herein as generating electricity).

An "electric power stream" is used herein to refer to a specific load, or a transfer of electricity/electric power/electric energy over time. For example, a wind power plant and a coal power plant may both generate electric power, but each generates independent electric power streams. Typically, a power plant generates electric power and transmits some or all of that electric power to one or more substations (via an electric power stream transmitted along, for example, one or more power transmission lines) to each substation.

For example, a first coal power plant may generate around 500 megawatts (MW) of electric power. That first coal power plant may transmit the 500 MW to accommodate the demands of three independent substations. This may be accomplished via, for example, three electric power streams—the plant may transmit a first electric power stream including 200 MW to a first substation, a second electric power stream including 250 MW to a second substation, and third electric power stream including 50 MW to a third substation. To be clear, a second example coal power plant may generate around 550 MW of electric power and distribute that 550 MW through a single electric power stream of 550 MW to a sole substation. Note also that substations may receive electric power streams from multiple sources (e.g., power plants, other substations, etc.).

Throughout this disclosure, reference is made to "source identifiers" as well as "embedding" the source identifiers into electric current. As used herein, a "source identifier" refers to a signal that contains data labeling a source of electricity. Such a signal may be embodied as an electric current.

Since electric power is also distributed in the form of electric current, a source identifier current can be combined with, or "embedded within," the electric power current. In some embodiments, the source identifier current may simply be added to the electric power current. A resulting combined electric current may have the electric energy demanded by users in addition to "carrying" the source identification data.

Alternating Current (AC) power is typically transmitted as a sine wave, square wave or triangle wave. Minor variations in such a wave (such as to period, amplitude, etc.) may be added. For example, a wiring system may be configured to combine an input current (such as an AC current) with a modulated carrier signal to encode source identification information. The variations may have a negligible impact on the AC current for purposes of power transmission but may be detected by a downstream recipient and decoded to reveal source identification information.

To transmit electric power, an entity (such as, for example, a power plant, substation, etc.) may acquire a first electric current and prepare a downstream electric current based on the first electric current. For example, a power plant may "acquire" a first electric current by generating it (e.g., via burning coal, a wind turbine turning, etc.). A substation may "acquire" a first electric current by receiving it (such as from a power plant or a different substation). "Preparing" a downstream electric current, as used herein, refers to, for example, filtering, modulating, or otherwise modifying the first electric current. In some embodiments, "preparing" a downstream electric current includes embedding a source identifier, as described in further detail below.

A source identifier may be an "upstream" or "downstream" source identifier. As used herein, an entity (such as, for example, a substation) receives upstream source identifiers and generates/transmits downstream source identifiers. Thus, if a first entity generates a source identifier and transmits it to a second entity, that source identifier is both the first entity's downstream source identifier and the second entity's upstream source identifier.

Electric power is transmitted through the use of electric current. As will be understood by one of ordinary skill in the art, electric current may be transmitted in the form of alternating current (AC) or direct current (DC), and may be subjected to one or more operations such as filtering, modulation, etc. Each electric power stream may take the form of electric current. A substation receiving multiple electric power streams may distribute incoming electric power by generating an "aggregate" electric power stream (in the form of a generated electric current). Thus, multiple inputs may be combined into a single output.

The term "power plant," as used herein, refers to an electric power generating facility (sometimes referred to in the art as "power stations," "generating stations," etc.). A "source" of electric power, as used herein, refers to an originating power plant of that electric power. For example, if Wind Plant X transmits 50 MW to an end user, the "source" of that 50 MW would be "Wind Plant X." A "type" of electric power refers to a general category of the source of the power; in the preceding example, the "type" of the 50 MW may simply be "wind." In some embodiments, "type" may be more generalized (e.g., "green" vs. "not green" or "local" vs "not local" rather than "wind" vs. "coal"), may be "unknown" or "mixed," may be represented as a numerical value (e.g. from 0 to 1, with 1 referring to "renewable" and 0 referring to "nonrenewable"), etc.

Throughout this disclosure, reference is made to one or more "source identifiers" generated and/or transmitted in the context of electric power. As used herein, a "source identifier" includes data describing the source and/or type of electric power. For example, Wind Plant X may transmit 50 MW of electric power to a substation via one or more electric power streams in the form of one or more electric signals, but may additionally transmit a source identifier "alongside" (contemporaneously with, or even embedded within) the electric signal(s). The source identifier may describe that the electric signal originates from "Wind Plant X," that the source of the electric signal is a "wind" type of source, or both. A recipient of the electric signal (such as, for example, a substation or end user) may detect the source identifier and take one of a variety of actions (depending upon, for example, the information included and/or encoded within the source identifier, settings of the recipient's electric system(s), etc.). For example, a substation receiving solely "wind-type" power may, when distributing the power to an electric grid, generate a downstream source identifier to pass along the information that the power is from a wind source. In some embodiments, the downstream source identifier may be less specific (for example, may simply indicate that the power is "green," not specifically that it is of "wind-type"). In some embodiments, the substation may simply relay the received source identifier.

Throughout this disclosure, reference is made to "downstream" electric currents. As used herein, an entity (such as a power plant, a substation, etc.) may prepare a downstream electric current and transmit the downstream electric current to a recipient (such as a substation, an end-user, an electric grid, etc.).

Figure 1:
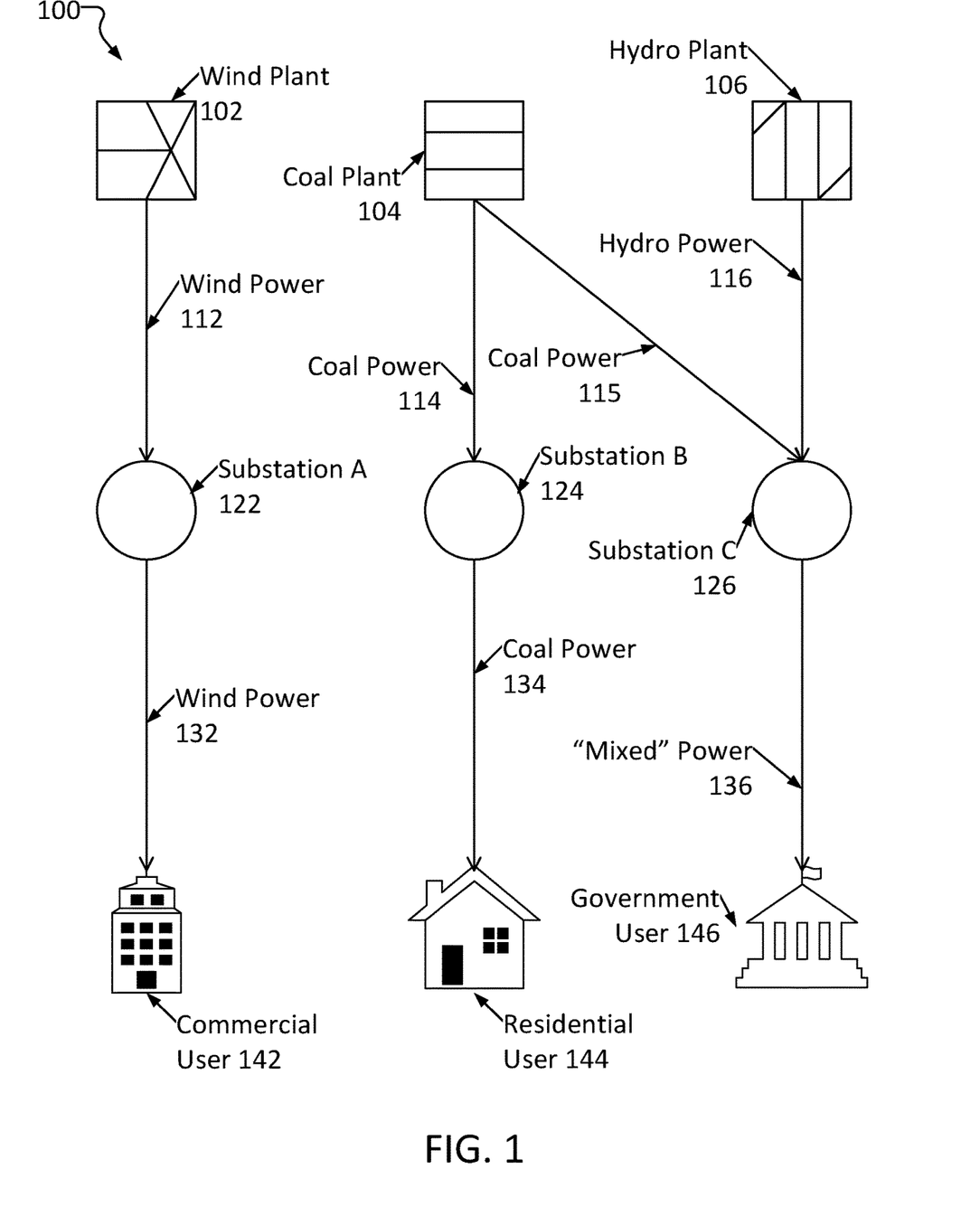
FIG. 1 illustrates a source-identifying electric power distribution system according to several embodiments of the present disclosure.

FIG. 1 illustrates a source-identifying electric power distribution system 100 according to several embodiments of the present disclosure. System 100 is depicted in the context of a simplified, linear approximation of an electric grid. System 100 includes power plants such as wind plant 102, coal plant 104 and hydroelectric (hydro) plant 106 (collectively "power plants 102-106"). Each power plant may produce electric power according to its principles of operation. Some power plants may, for example, operate by rotating a turbine within a magnetic field, which creates an electric current. In FIG. 1, for example, wind plant 102 may include a turbine connected to one or more blades that are rotated by atmospheric wind. Similarly, coal plant 104 may burn coal to generate steam that pushes a turbine, and hydro plant 106 may connect a turbine to a wheel that is turned by naturally flowing water.

Power plants 102-106 transmit electric power to one of three example substations, including substation A 122, substation B 124, and substation C 126 (collectively, substations 122-126). As illustrated, wind plant 102 transmits wind power stream 112 to substation A 122. Coal plant 104 transmits a first coal power stream 114 to substation B 124 and a second coal power stream 115 to substation C 126. Finally, hydroelectric plant 106 transmits hydroelectric power stream 116 to substation C 126. The electric power streams generated by power plants 102-106 are collectively referred to as "streams 112-116."

Notably, one or all of streams 112-116 may be transmitted alongside source identification information. For example, prior to transmitting power to substation C 126, hydroelectric plant 106 may modify the electric signal of its electric power stream in order to embed a source-identification signal therein. Thus, hydroelectric power stream 116 may include a source identifier. In some embodiments, this source identifier may be a simple alternating current sine wave, where a frequency of the sine wave is agreed to correspond to a particular source. For example, a source identifier at 25 Hz may be agreed upon to correspond to a hydroelectric plant, a source identifier at 30 Hz may be agreed to correspond to a coal plant, etc.; thus, the electric current transmitted in hydroelectric power stream 116 may include an embedded source identifier current at 25 Hz.

In some embodiments, source identifier information may be transmitted "outside" of the electric signals themselves. For example, in some embodiments, a power plant such as wind plant 102 may broadcast a radio frequency signal indicating how much power it is transmitting and where it is transmitting the power to. In other words, wind plant 102 may broadcast a signal that describes wind power stream 112 as being of a "wind" type. Substation A 122 may receive this broadcast in addition to stream 112 and determine that stream 112 includes wind power. Notably, such a broadcast may also identify that substation A is the sole recipient (directly or indirectly; a broadcast may include an exhaustive list of recipients, which may be anonymized via an encoded identifier, etc.). Thus, even if substation B 124 detects the broadcast, substation B 124 is able to identify that the broadcast does not refer to stream 114 and therefore is protected from misinterpreting stream 114 as being of a "wind" type. In some embodiments, the source identifier may be broadcast to a predetermined group of recipients, such as a group of recipients in a geographic service region. For example, a power plant may broadcast the source identifier to every substation in a given radius of the plant itself, or to a group of homes in a suburb of a nearby city, etc.

When receiving streams 112-116, substations 122-126 are configured to distribute electric power to one of commercial user 142, residential user 144, and government user 146 (collectively, "users 142-146"). For example, substation A 122 may transmit electric power stream 132 to commercial user 142, substation B 124 may transmit electric power stream 134 to residential user 144, and substation C may transmit electric power stream 136 to government user 146. Electric power streams 132, 134 and 136 are collectively referred to herein as "streams 132-136."

One or more of substations 122-126 may generate and/or broadcast a downstream source identifier alongside or embedded within its corresponding electric power stream. For example, substation B 124, upon receiving an upstream source identifier indicating that stream 114 is a coal power stream, may generate a downstream source identifier indicating that power stream 134 originated from a coal power plant and transmit it to residential user 144. In other words, substation B 124 may relay the source identification information to residential user 144, such that residential user 144 may be informed that electric power stream 134 is a coal-type electric power stream. In some embodiments, the downstream source identifier transmitted by substation B 124 may be substantially identical to the upstream source identifier that substation B 124 received from coal plant 104. In some embodiments, substation B 124 may simply rebroadcast or otherwise "pass along" the upstream source identifier received from coal plant 104. In some embodiments, substation B 124 may generate its own downstream source identifier; for example, substation B 124 may receive a radio frequency broadcast signal from coal plant 104 identifying stream 114 as a coal-type stream, and in response, substation B 124 may embed a downstream source identifier into electric power stream 134 to identify electric power stream 134 as originating from a "non-green" source.

Notably, substations may receive electric power streams from multiple different sources. For example, in system 100, substation C 126 receives stream 115 from coal plant 104 and stream 116 from hydroelectric plant 106. Substation C 126 may detect multiple upstream source identifiers (for example, a first upstream source identifier from coal plant 104 identifying stream 115 as coal-type power and a second upstream source identifier from hydroelectric plant 106 identifying stream 116 as hydroelectric-type power). In response, in some embodiments substation C 126 may generate a downstream source identifier to be transmitted alongside power stream 136 to government user 146 based on both upstream source identifiers.

In some embodiments, a downstream source identifier may include information identifying multiple different sources of an electric power stream. In some embodiments, a downstream source identifier may simply identify that an associated electric power stream "includes" electric power generated by more than one source. In other words, in some embodiments the downstream source identifier may describe stream 136 as "coal/hydroelectric"-type power, while in some embodiments the downstream source identifier may describe stream 136 as "mixed"-type power.

In some embodiments, a downstream source identifier may include a proportion of different types of power or power originating from different sources. This may be based on, for example, an amount of power received from each source and corresponding upstream source identifiers. For example, substation C 126 may receive 80 MW from hydroelectric power plant 106 (e.g., stream 116 may transmit 80 MW of power and be accompanied by a first upstream source identifier identifying stream 116 as hydroelectric-type power) and substation C 126 may also receive 240 MW from coal plant 104 (e.g., stream 115 may transmit 240 MW of power and be accompanied by a second upstream source identifier identifying stream 115 as coal-type power). Substation C 126 may be configured to leverage this information to generate a downstream source identifier to identify that electric power stream 136 is "25% hydroelectric and 75% coal."

In some embodiments, some power plants may not distribute source identifiers, or they may be lost/undetected/filtered out, etc. This may occur for a variety of reasons; older power plants may not be fitted with the means for generating and/or transmitting source identifiers, an operator of the power plant may refuse to transmit a source identifier, a source identifier may be transmitted in a format unintelligible to an intended recipient, etc. Thus, in some embodiments a substation may not be able to determine the exact makeup of its sources. For example, substation C 126 may receive 80 MW of hydroelectric power in the form of stream 116 from hydroelectric plant 106, along with an upstream source identifier indicating stream 116 as hydroelectric, but may also receive 240 MW of electric power from coal plant 104 without an accompanying, associated, or otherwise corresponding upstream source identifier. In such a situation, substation C 126 may only be able to confirm that stream 116 is of a hydroelectric type. Thus, in generating a downstream source identifier to transmit alongside stream 136 to user 146, substation C 126 may label stream 136 as "25% hydroelectric, 75% unknown." In some embodiments, stream 136 may simply be labeled "unknown," "unknown mixture (at least 25% hydroelectric)," etc. While the examples described herein refer to mixtures as percentages, other formats of source identifiers are fully considered herein (such as, for example, including specific magnitudes of power streams; e.g., "80 MW hydroelectric, 240 MW unknown," etc.).

Note that the varying substations, users, plants etc. depicted in system 100 of FIG. 1 are selected for exemplary purposes only; as will be understood by one of ordinary skill in the art, the concepts described above could be applied to different combinations and/or layouts of an electric grid. In some embodiments, a substation may distribute power to one or more other substations. In some embodiments, a power source may transmit electric power directly to an end user.

Figure 2:
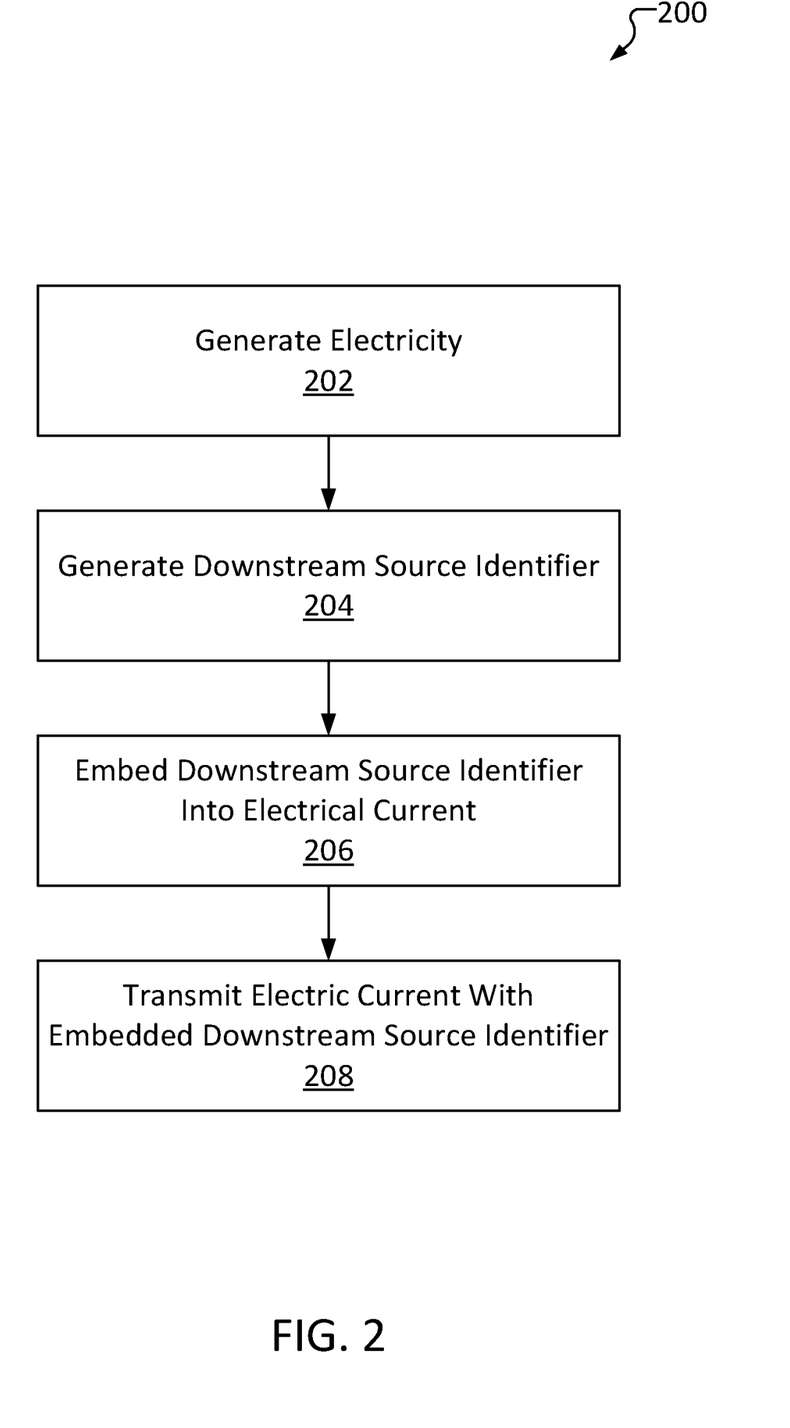
FIG. 2 illustrates an electric power generation method including source identification consistent with several embodiments of the present disclosure.

FIG. 2 illustrates an electric power generation method 200 including source identification consistent with several embodiments of the present disclosure. Method 200 may be performed by a power source, such as a power generating station/power plant (for example, one of power plants 102-106 of FIG. 1). Method 200 includes generating electricity at operation 202. Operation 202 includes causing a power generator to generate electric current. The specific nature of operation 202 may depend upon the configuration/"type" of power source performing method 200. For example, operation 202 may include causing a furnace to burn coal in order to heat/boil water, wherein the steam from the water may push a turbine, causing it to rotate, generating electricity. As another example, operation 202 may include unlocking, reorienting or otherwise allowing a propeller to be rotated by atmospheric wind, turning a turbine, and thus generating electricity.

Method 200 further includes generating a downstream source identifier at operation 204. Operation 204 may include, for example, selecting a style of source identification to implement (such as, for example, RF broadcast, internet upload, or directly embedding a source identifier into an electric signal). For purposes of FIG. 2, the "direct embedding" style is assumed to have been selected. Operation 204 may further include generating data to be included in the source identifier. For example, if a system performing method 200 is a coal plant, operation 204 may include accessing a standardized database to identify an identification code corresponding to a coal power plant. In some embodiments, operation 204 may include generating a downstream source identifier that describes a "type" of power to be transmitted (e.g., coal, wind, "green," "fossil fuel," etc.). In some embodiments, operation 204 may include generating a downstream source identifier to specifically identify the system performing method 200 (e.g., "Acme Coal Plant, 123 E Broadway St."). Combinations of the above are also considered herein. Operation 204 may hash, encrypt, and/or otherwise obscure the information to be transmitted in the downstream source identifier using one or more known methods (e.g., secure hash algorithm 256 (SHA 256), etc.).

If the electricity is to be transmitted to more than a single recipient (as in, via multiple output streams), operation 204 may further include generating downstream source identification information to be embedded within each output stream. For example, if a solar power plant is to transmit 50 MW along a first path to a first recipient and 75 MW along a second path to a second recipient, operation 204 may include generating a first downstream source identifier to be transmitted along the first path and/or to the first recipient indicating "50 MW solar" and a second downstream source identifier to be transmitted along the second path and/or to the second recipient indicating "75 MW solar." In some embodiments, the downstream source identifier may indicate additional information such as, for example, proportion of total power generated (e.g., "75 MW out of 125 MW total, solar"), peak possible output (e.g., "75 MW out of 125 MW current total, 175 MW maximum; 50 MW available, solar"), total energy generated (e.g., "75 MW, solar—750 GJ so far"), intended recipient (e.g., 75 MW to substation D, solar"), etc. As will be understood by one of skill in the art, combinations of the above are also considered.

Method 200 further includes embedding the downstream source identifier into the electric current at operation 206. Operation 206 may include, for example, preparing a downstream electric current by adding a carrier signal encoding the downstream source identifier to the electric current or otherwise combining the downstream source identifier current to/with the received electric current into a combined electric current. Thus, the electric current also carries data regarding the source of the electricity.

Method 200 further includes transmitting the combined downstream electric current at operation 208. Operation 208 may include transmitting some or all of the generated electric power to one or more recipients, such as substations, end users, etc., as described with reference to operation 204, above.

In some embodiments, operation 208 may further include emitting one or more radio frequency (RF) broadcasts to transmit data corresponding to the downstream source identifier(s). In some embodiments, operation 208 may include uploading the downstream source identifiers to the internet, such as to one or more (possibly cloud-based) servers. Combinations of the above are also considered; in some embodiments, operation 208 may include uploading a downstream source identifier to a server electric signal and broadcasting the same downstream source identifier via RF. In some embodiments wherein more than one output stream is transmitted at operation 206, operation 208 may include embedding a first downstream source identifier into a first downstream electric current, embedding a second downstream source identifier into a second downstream electric current, and broadcasting the second source identifier via RF.

In some embodiments, a power generating station may be in communicative contact with one or more recipients. A source identifier may be transferred via or based on this communicative contact. For example, a first substation may specifically "request" that source identification information be embedded in an electric signal, while a second substation may request that the source identifier be broadcast via RF. Of course, a third substation may request that the source identification information be transmitted across the same communications link used to submit the request in the first place.

Figure 3:
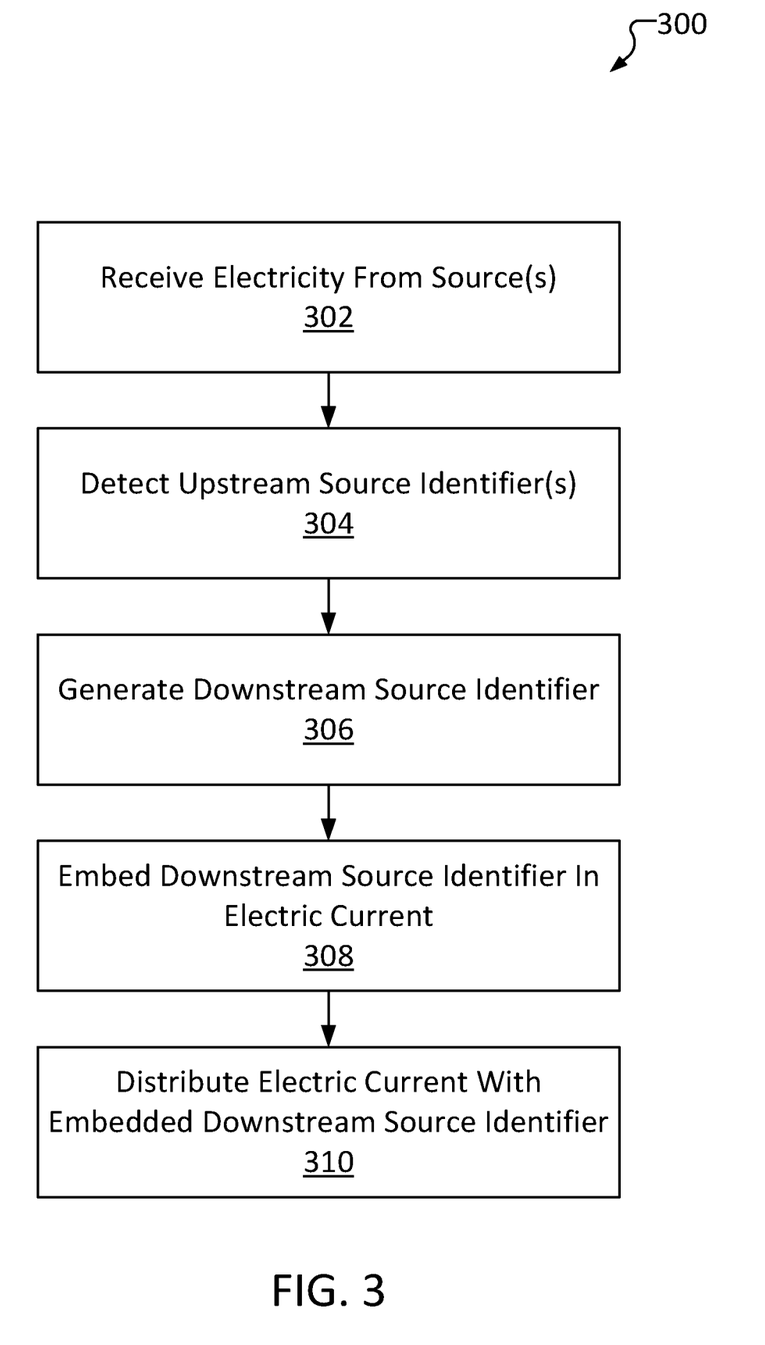
FIG. 3 illustrates a source-identifying electric power distribution method consistent with several embodiments of the present disclosure.

FIG. 3 illustrates a source-identifying electric power distribution method 300 consistent with several embodiments of the present disclosure. Method 300 may be performed by an "intermediary" such as an electric power substation, relay, etc. (such as, for example, one of substations 122-126 of system 100). Method 300 includes receiving electricity from one or more sources at operation 302. Operation 302 may include, for example, receiving a first electric power stream (including a first electric current) from a first power plant or even from another intermediary. Operation 302 may further include determining at least a magnitude of power received via the electric power stream (e.g., 200 MW, 30 MW, etc.).

Method 300 further includes detecting a upstream source identifier(s) at operation 304. Operation 304 may include, for example, receiving an RF broadcast, accessing an internet database (or receiving a notification from an internet-based server), or detecting, as a result of performing signal analysis, an embedded upstream identifier signal in the electric current itself. The upstream source identifier(s) detected in operation 304 may include information describing the source of one or more of the electric power stream(s) received at operation 302. In some embodiments, a first upstream source identifier may include a magnitude of power transmitted, enabling a system performing method 300 to verify that the first upstream source identifier applies to a first electric power stream.

Method 300 further includes generating a downstream source identifier at operation 306. Operation 306 may include, for example, generating a downstream source identifier based on the upstream source identifier(s) detected at operation 304. As an illustrative example, a first upstream source identifier may indicate that a first electric power source (having a magnitude of 30 MW) is "solar," while a second and a third upstream source identifier may indicate that corresponding second and third electric power streams (having magnitudes of 100 MW and 400 MW, respectively) are "coal." In such an example, operation 306 may include generating a downstream source identifier to indicate that an electric power stream to be output by the system performing method 300 includes 30 MW of solar-sourced power and 500 MW of coal-sourced power. If multiple outputs are to be distributed, multiple downstream source identifiers may be generated at operation 306. However, while multiple downstream source identifiers may differ in some ways ("style," formatting, magnitude, etc.), the distribution of sources may generally be the same for each downstream source identifier, as described in further detail below.

In some embodiments, only a single ("first") upstream source identifier and/or electric power stream may be received. In at least some such embodiments, operation 306 may simply include copying or otherwise replicating the first upstream source identifier received at operation 304. In some embodiments, operation 306 may simply be skipped (for example, if the sole upstream source identifier is embedded in the sole electric current, then an output electric current may already include the appropriate source identification information). In some embodiments, even if only a single upstream source identifier is detected, operation 306 may still include generating an independent downstream source identifier. For example, in some embodiments the upstream source identifier detected at operation 304 may indicate that a source of the electric power is "Acme Geothermal." However, rather than including source identification information reflecting this, operation 306 may include generating a downstream source identifier labeling the electric power simply as "green." If the first upstream source identifier is embedded in the signal, in some embodiments it may be filtered out (via, for example, one or more bandpass filters, etc.).

In some embodiments, operation 304 may not successfully detect an upstream source identifier associated with every electric power stream. If one or more upstream source identifiers are missing, operation 306 may include labeling or otherwise identifying at least a "portion" of an output electric current as "unknown." Note that while a system performing method 300 may (re)distribute received electric power to multiple recipients via outputting multiple electric power streams (possibly having different magnitudes of power), the "mixture" of source information aggregated at operation 306 may be constant between them. In other words, if a substation receives 75 MW of coal and 25 MW of solar power (100 MW total), the downstream source identifier generated at operation 306 may label all output electric power streams as "75% coal, 25% solar"). Thus, even if the system outputs 30 MW to a first recipient, 25 MW to a second recipient, and 45 MW to a third recipient, all three outputs may be labeled as "75% coal, 25% solar" (or similar).

Depending upon configuration of the system performing method 300, separation of sources may not be possible. In other words, the system may not be capable of controlling the output in order to send "all 25 MW of solar" to the second recipient. However, the system may be capable of monitoring changes to the upstream source identifiers and updating the downstream source identifier accordingly in real time. For example, as circumstances change, a solar plant's output may drop dramatically (such as when the sun goes down). Thus, power consumption may be weighted far more heavily in favor of coal, etc. This may be reflected in upstream source identifiers showing shifting magnitudes of power being transmitted, and operation 306 may further pass this information along by updating the downstream source identifier.

Method 300 further includes embedding the downstream source identifier into the electric current at operation 308. Operation 308 may include, for example, preparing a downstream electric current by adding a carrier signal encoding the downstream source identifier to the electric current or otherwise combining the downstream source identifier current to/with the received electric current into a combined electric current. Thus, the electric current also carries data regarding the source of the electric power.

Method 300 further includes distributing electricity with the embedded downstream source identifier at operation 310. Note that operation 310 may include distributing multiple electric power streams (to multiple recipients). However, the "source" (or "makeup," "distribution," "proportions" etc.) of the multiple electric power streams, as identified by the downstream source identifier generated at operation 306, may be constant for each output stream. Operation 310 may include distributing electric power via an electric grid to one or more recipients. Recipients may include, for example, a substation, an end-user (such as a residential user, commercial user, etc.), etc. As the downstream source identifier is combined into the electric current, operation 310 includes distributing the downstream source identifier as well.

In some embodiments, a system performing method 300 may further transmit the downstream source identifier(s) via other means. For example, the system may emit one or more radio frequency (RF) broadcasts to transmit data corresponding to the downstream source identifier. In some embodiments, the system may upload the downstream source identifiers to the internet, such as to one or more (possibly cloud-based) servers. Combinations of the above are also considered; in some embodiments, a system performing method 300 may upload the downstream source identifier to a server and broadcast the same downstream source identifier via RF. In some embodiments wherein more than one output stream is transmitted at operation 310, operation 308 may include embedding a first downstream source identifier into a first downstream electric current and embedding a second downstream source identifier into a second downstream electric current, while the system performing method 300 may further broadcast the second downstream source identifier associated with the second downstream electric current via RF.

In some embodiments, a system performing method 300 may be in communicative contact with one or more recipients. A downstream source identifier may be transferred via or based on this communicative contact. For example, a first recipient (such as a substation) may specifically request that source identification information be embedded in an electric signal, while a second recipient (such as, for example, a commercial user) may request that the downstream source identifier be broadcast via RF. Of course, a third recipient (such as, for example, a residential user) may request that the source identification information be transmitted across the same communications link used to submit the request in the first place.

Figure 4:
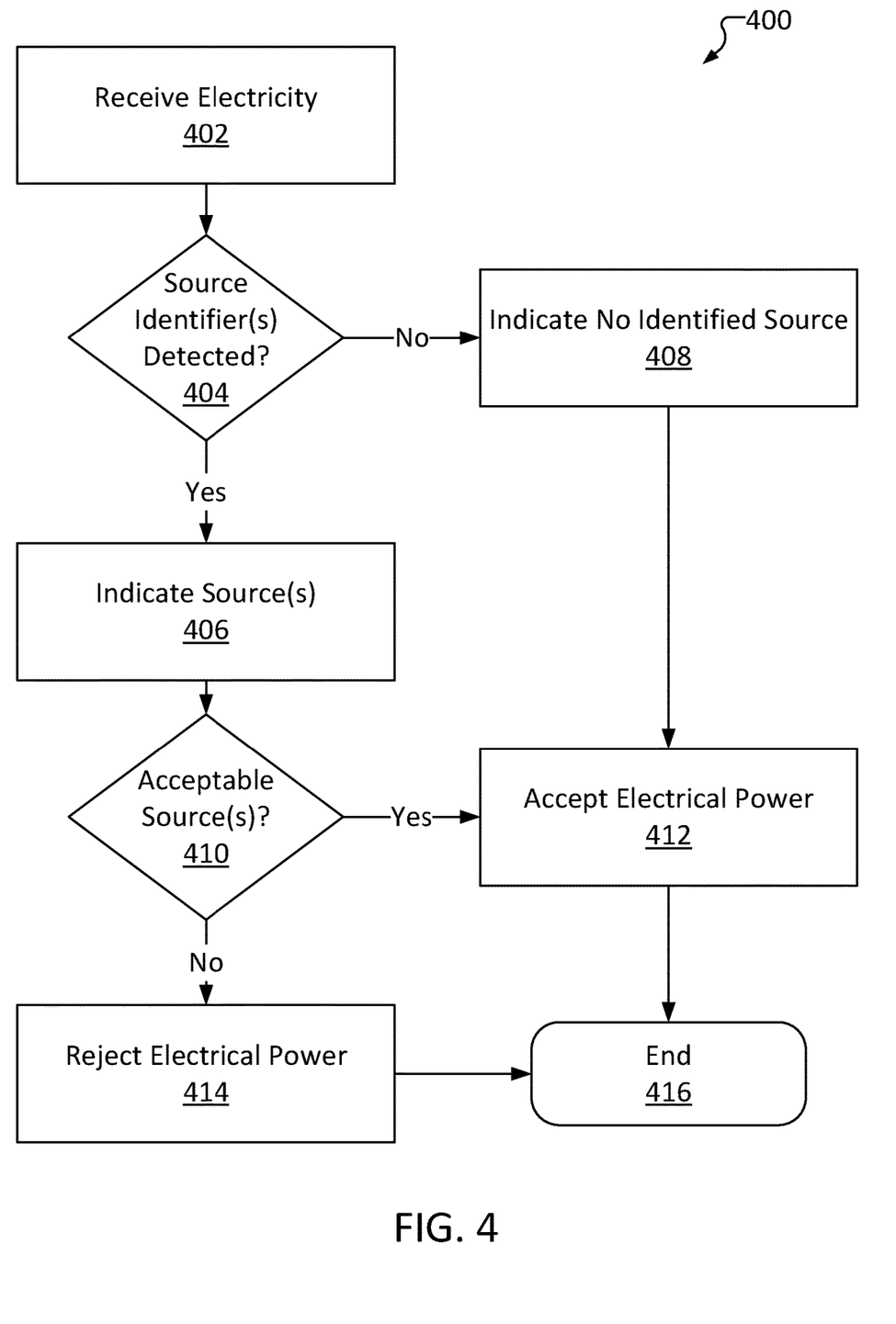
FIG. 4 illustrates a source-discriminating electric power consumption method according to several embodiments of the present disclosure.

FIG. 4 illustrates a source-discriminating electric power consumption method 400 according to several embodiments of the present disclosure. Method 400 may be performed by, for example, a device connected to in an end-user's electric system, such as a "smart outlet," "smart meter," "smart charger," a bank of batteries or capacitors, etc. Method 400 includes receiving electricity at operation 402. Operation 402 may include, for example, receiving a first electric power stream (including a first electric signal) via, for example, an electric power transmission line. In some embodiments, operation 402 may further include determining at least a magnitude of power received via the first electric power stream (e.g., 5 kW, 50 W, etc.). Method 400 may further include determining whether the any source identifier(s) can be identified at operation 404. Operation 404 may include, for example, performing signal analysis on the received electric signal to search for embedded source identification information, determining whether a radio frequency antenna has received an RF signal including source identification information, polling an online server to determine whether source information is included thereon, etc.

If a source identifier is detected (404 "Yes"), method 400 further includes indicating the sources of the received electricity at operation 406. Operation 406 may include, for example, illuminating one or more lights corresponding to a breakdown of the source(s) of the received electricity, causing information regarding the source(s) of the received electricity to be depicted on one or more displays, emitting a sound, etc.

As an example, in some embodiments wherein method 400 is being performed by a "smart outlet" of a residential home, the smart outlet may be equipped with one or more source indicator lights, such as a red, yellow, and green lights (such as light-emitting-diode, or LEDs). A system performing method 400 may control a state (e.g., "on," "off," "25% brightness," etc.) of one or more of these source indicator lights based on the identified source. If the received source identifier indicates that the electricity received at operation 402 is 100% solar, the smart outlet may cause the "green" source indicator light to be illuminated. If the received source identifier indicates that the electricity received at operation 402 is 100% coal, the smart outlet may cause the "red" source indicator light to be illuminated. If the received source identifier indicates that the electricity received at operation 402 is a mixture (e.g., if portions of the electricity originate from different sources, such that the electric current received at operation 402 is a composition from a plurality of sources) or unknown, the smart outlet may cause the "yellow" source indicator light to be illuminated. Other configurations and settings are also possible and fully contemplated herein, as would be understood by those of ordinary skill in the art.

As another example, in some embodiments method 400 may be performed by a smart meter. The smart meter may be equipped with a display, wherein operation 406 may include causing the display to depict a "breakdown" of the sources of the electricity received at operation 402.

As an additional example, in some embodiments operation 406 may include sending a signal or message to one or more devices. For example, a system performing method 400 may cause a notification to be sent to an end-user's mobile device, send an email, transmit an identity of the source to an Internet of Things (IoT) network such as a smart home, etc.

Method 400 further includes determining whether the source(s) of the electricity received at operation 402 are "acceptable" at operation 410. As used herein, a user or administrator of a system performing method 400 may be enabled to configure and/or specify which sources of electricity to accept vs. reject. For example, a smart charger performing method 400 may be configured to only accept coal-sourced electricity to charge an attached mobile device. Acceptability may be further based on other factors such as time of day (for example, rejecting non-solar sources during the day), consumption patterns (for example, enforcing a maximum percentage of non-green sourced electricity consumption), etc.

If the electricity received at operation 402 is determined to originate from an "acceptable" source (410 "Yes"), method 400 further includes "accepting" the electricity at operation 412. Operation 412 essentially includes, for example, allowing the received electricity to be used to charge an attached device, power an attached structure, etc. In some embodiments, operation 412 may include closing one or more electric circuits. Method 400 may then end at operation 416.

If the electricity received at operation 402 is determined to originate from an "unacceptable" source (410 "No"), method 400 further includes rejecting the electricity at operation 414. Operation 414 may include, for example, preventing usage and/or consumption of the received electricity (such as by, for example, utilizing a circuit breaker included in a system performing method 400 to open or otherwise break the electric circuit). In some embodiments, operation 414 may include "throttling" or otherwise limiting usage of the electricity. In some embodiments, operation 414 may include enforcing a maximum amount of energy permitted from the unacceptable source, beyond which the circuit may be throttled and/or broken. Method 400 may then end at operation 416. This may advantageously enable a user to control electricity consumption based on source of the electricity.

If no source identifier(s) can be identified (404 "No"), method 400 may indicate that no source identifier(s) could be identified (such as by illuminating a light, pushing a notification to a user's mobile device, emitting a sound, etc.). In some embodiments, lack of a source identifier may result in accepting the electricity at operation 412, and then ending at operation 416. However, this may depend upon configuration of the system performing method 400; in some embodiments, only electricity which is identified as coming from an acceptable source may be accepted, in which case operation 408 may proceed to rejecting the electricity at operation 414 instead. In essence, method 400 may operate on a "blacklist" (as shown in FIG. 4) system, wherein default behavior is to accept the electricity, or on a "whitelist" system (wherein operation 408 may proceed to operation 414), wherein default behavior is to reject electricity unless it is explicitly deemed and identified as acceptable.

Figure 5:
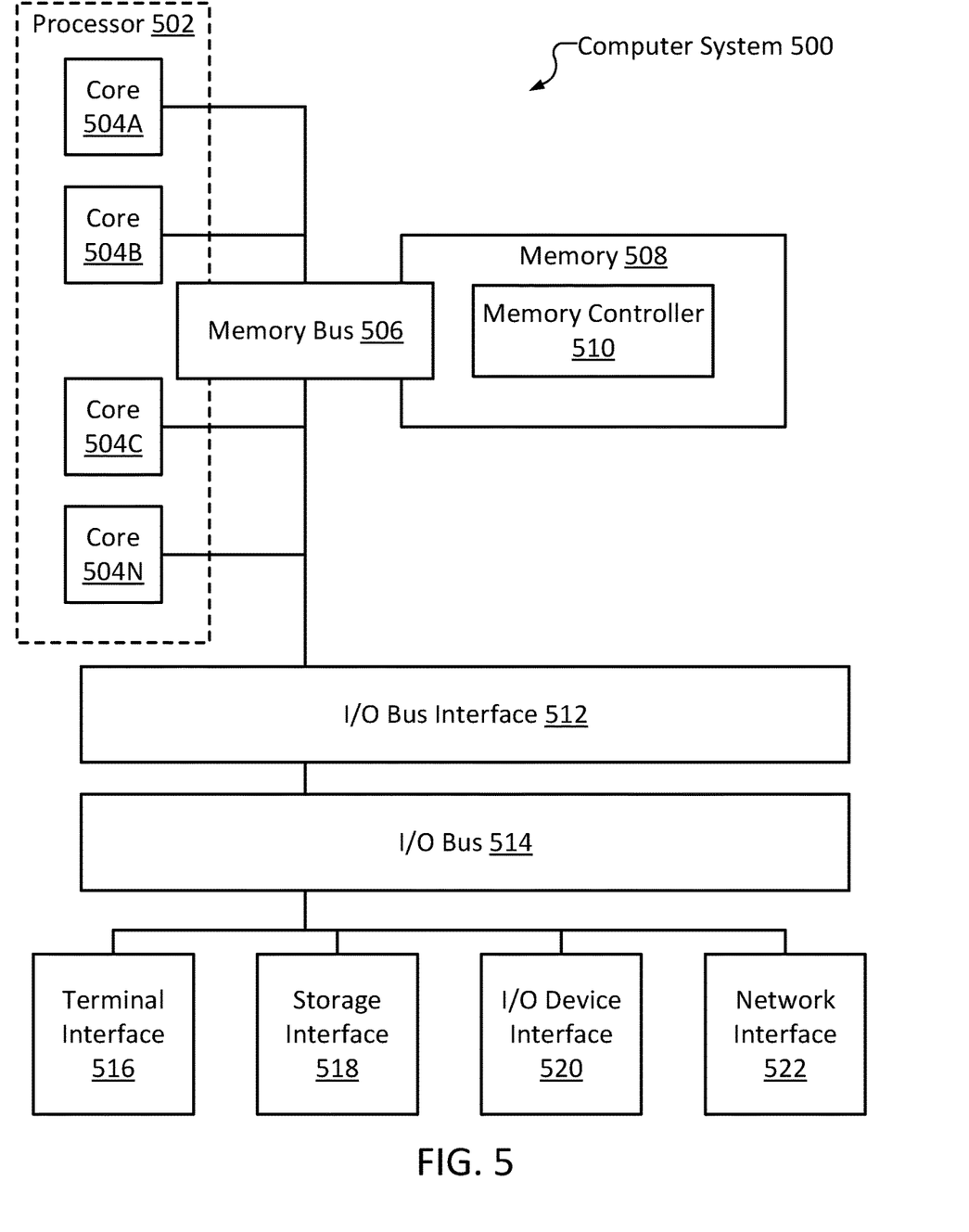
FIG. 5 illustrates a high-level block diagram of an example computer system that may be used in implementing embodiments of the present disclosure.

Referring now to FIG. 5, shown is a high-level block diagram of an example computer system 500 that may be configured to perform various aspects of the present disclosure, including, for example, methods 200, 300 and 400. The example computer system 500 may be used in implementing one or more of the methods or modules, and any related functions or operations, described herein (e.g., using one or more processor circuits or computer processors of the computer), in accordance with embodiments of the present disclosure. In some embodiments, the major components of the computer system 500 may comprise one or more CPUs 502, a memory subsystem 508, a terminal interface 516, a storage interface 518, an I/O (Input/Output) device interface 520, and a network interface 522, all of which may be communicatively coupled, directly or indirectly, for inter-component communication via a memory bus 506, an I/O bus 514, and an I/O bus interface unit 512.

The computer system 500 may contain one or more general-purpose programmable central processing units (CPUs) 502, some or all of which may include one or more cores 504A, 504B, 504C, and 504D, herein generically referred to as the CPU 502. In some embodiments, the computer system 500 may contain multiple processors typical of a relatively large system; however, in other embodiments the computer system 500 may alternatively be a single CPU system. Each CPU 502 may execute instructions stored in the memory subsystem 508 on a CPU core 504 and may comprise one or more levels of on-board cache.

In some embodiments, the memory subsystem 508 may comprise a random-access semiconductor memory, storage device, or storage medium (either volatile or non-volatile) for storing data and programs. In some embodiments, the memory subsystem 508 may represent the entire virtual memory of the computer system 500 and may also include the virtual memory of other computer systems coupled to the computer system 500 or connected via a network. The memory subsystem 508 may be conceptually a single monolithic entity, but, in some embodiments, the memory subsystem 508 may be a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures. In some embodiments, the main memory or memory subsystem 804 may contain elements for control and flow of memory used by the CPU 502. This may include a memory controller 510.

Although the memory bus 506 is shown in FIG. 5 as a single bus structure providing a direct communication path among the CPU 502, the memory subsystem 508, and the I/O bus interface 512, the memory bus 506 may, in some embodiments, comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 512 and the I/O bus 514 are shown as single respective units, the computer system 500 may, in some embodiments, contain multiple I/O bus interface units 512, multiple I/O buses 514, or both. Further, while multiple I/O interface units are shown, which separate the I/O bus 514 from various communications paths running to the various I/O devices, in other embodiments some or all of the I/O devices may be connected directly to one or more system I/O buses.

In some embodiments, the computer system 500 may be a multi-user mainframe computer system, a single-user system, or a server computer or similar device that has little or no direct user interface but receives requests from other computer systems (clients). Further, in some embodiments, the computer system 500 may be implemented as a desktop computer, portable computer, laptop or notebook computer, tablet computer, pocket computer, telephone, smart phone, mobile device, or any other appropriate type of electronic device.

It is noted that FIG. 5 is intended to depict the representative major components of an exemplary computer system 500. In some embodiments, however, individual components may have greater or lesser complexity than as represented in FIG. 5, components other than or in addition to those shown in FIG. 5 may be present, and the number, type, and configuration of such components may vary.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electric signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method, comprising:
receiving a first electric current;
detecting a first upstream source identifier embedded in the first electric current, the first upstream source identifier including data describing at least one of:
a first source of the first electric current;
an intended recipient of the first source; and
a peak possible output of the first source;
generating, using the first upstream source identifier, a first downstream source identifier;
preparing, based at least on the first electric current, a first downstream electric current;
embedding the first downstream source identifier into the first downstream electric current; and
transmitting the first downstream electric current including the first downstream source identifier.

2. The method of claim 1, wherein the first upstream source identifier includes data describing a first type of the first electric current.

3. The method of claim 2, further comprising:
receiving a second electric current; and
detecting a second upstream source identifier, wherein:
the second upstream source identifier includes data describing at least one of:
a second source of the second electric current; and
a second type of the second electric current;
the generating the first downstream source identifier also uses the second upstream source identifier; and
the preparing the first downstream electric current is based further on the second electric current.

4. The method of claim 1, further comprising:
generating a source identification signal based at least on the first downstream source identifier; and
transmitting the source identification signal to one or more recipients.

5. The method of claim 4, wherein the transmitting the source identification signal includes broadcasting the source identification signal to a geographic service region.

6. The method of claim 1, wherein the first source is one of a solar plant, a wind plant, a hydroelectric plant, a geothermal plant, a coal plant, or a natural gas plant.

7. The method of claim 3, wherein the first type is the second type.

8. A system, comprising:
a memory; and
a central processing unit (CPU) including one or more CPU cores, the CPU configured to:
receive a first electric current;
detect a first upstream source identifier embedded in the first electric current, the first upstream source identifier including data describing at least one of:
a first source of the first electric current; and
a peak possible output of the first source;
receive a second electric current;
detect a second upstream source identifier, wherein the second upstream source identifier includes data describing a second source of the second electric current;
generate, using the first upstream source identifier and the second upstream source identifier, a first downstream source identifier;
prepare, based at least on the first electric current and the second electric current, a first downstream electric current;
embed the first downstream source identifier into the first downstream electric current; and
transmit the first downstream electric current including the first downstream source identifier.

9. The system of claim 8, wherein the CPU is further configured to:
generate a source identification signal based at least on the first downstream source identifier; and
transmit the source identification signal to one or more recipients.

10. The system of claim 9, wherein the transmitting the source identification signal includes broadcasting the source identification signal to a geographic service region.

11. The system of claim 8, wherein the first source is one of a solar plant, a wind plant, a hydroelectric plant, a geothermal plant, a coal plant, or a natural gas plant.

12. The system of claim 8, wherein the first upstream source identifier includes data describing a first type of the first electric current.

13. The system of claim 8, wherein the first upstream source identifier also includes data describing an intended recipient of the first source.

14. The system of claim 12, wherein the second upstream source identifier includes data describing a second type of the second electric current and wherein the first type is the second type.

15. A computer program product, the computer program product comprising a computer readable storage medium having program instructions embodied therewith, the program instructions executable by a computer to cause the computer to:
receive a first electric current;
detect a first upstream source identifier embedded in the first electric current, the first upstream source identifier including data describing at least one of:
a first source of the first electric current;
an intended recipient of the first source; and
a peak possible output of the first source;
generate, using the first upstream source identifier, a first downstream source identifier;
prepare, based at least on the first electric current, a first downstream electric current;
embed the first downstream source identifier into the first downstream electric current; and
transmit the first downstream electric current including the first downstream source identifier.

16. The computer program product of claim 15, wherein the first upstream source identifier includes data describing a first type of the first electric current.

17. The computer program product of claim 16, wherein the instructions further cause the computer to:
receive a second electric current; and
detect a second upstream source identifier, wherein:
the second upstream source identifier includes data describing at least one of:
a second source of the second electric current; and
a second type of the second electric current;
the generating the first downstream source identifier also uses the second upstream source identifier; and
the preparing the first downstream electric current is based further on the second electric current.

18. The computer program product of claim 15, wherein the instructions further cause the computer to:
generate a source identification signal based at least on the first downstream source identifier; and
transmit the source identification signal to one or more recipients.

19. The computer program product of claim 18, wherein the transmitting the source identification signal includes broadcasting the source identification signal to a geographic service region.

20. The computer program product of claim 17, wherein the first type is the second type.

* * * * *